United States Patent
Shih

(10) Patent No.: US 7,166,499 B2
(45) Date of Patent: Jan. 23, 2007

(54) METHOD OF FABRICATING A THIN FILM TRANSISTOR FOR AN ARRAY PANEL

(75) Inventor: Chih-Hung Shih, Luodong Township, Yilan County (TW)

(73) Assignee: AU Optronics Corporation, Hsinchu (TW)

( * ) Notice: Subject to any disclaimer, the term of this patent is extended or adjusted under 35 U.S.C. 154(b) by 155 days.

(21) Appl. No.: 10/739,373

(22) Filed: Dec. 17, 2003

(65) Prior Publication Data

US 2005/0136574 A1    Jun. 23, 2005

(51) Int. Cl.
*H01L 21/00*  (2006.01)
*H01L 29/49*  (2006.01)

(52) U.S. Cl. .............. 438/149; 438/141; 257/E29.151

(58) Field of Classification Search .............. None
See application file for complete search history.

(56) References Cited

U.S. PATENT DOCUMENTS 5,346,833 A * 9/1994 Wu .............................. 438/30

5,990,998 A * 11/1999 Park et al. ................... 349/139
6,288,414 B1 * 9/2001 Ahn ............................. 257/72
6,683,660 B1 * 1/2004 Wu et al. ..................... 349/43

FOREIGN PATENT DOCUMENTS

JP    2003-303835    10/2003

* cited by examiner

*Primary Examiner*—Alonzo Chambliss
(74) *Attorney, Agent, or Firm*—Duane Morris LLP

(57) ABSTRACT

A method for making a thin film transistor, TFT, (306) on a substrate includes a photolithographic process step of patterning three layers of materials to form a TFT (306) and to form a bridging structure (308) crossing over a TFT gate bus-line conductor (202) at a cross over region; followed by patterning a conductor metal to form a TFT source electrode terminal (404) and a TFT drain electrode terminal (402), and to comprise a continuous data bus-line (206) extending over the bridging structure (308).

9 Claims, 13 Drawing Sheets

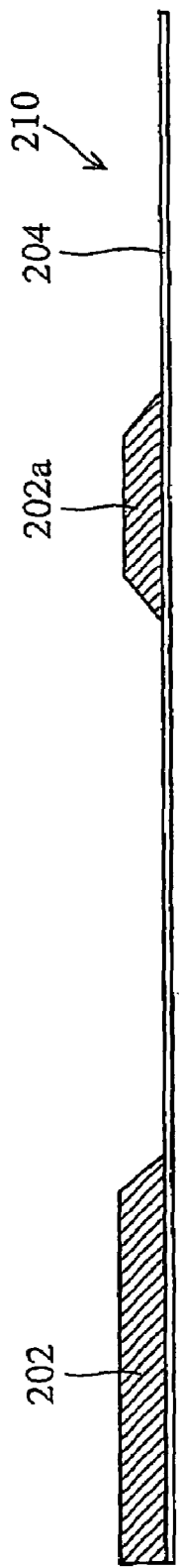
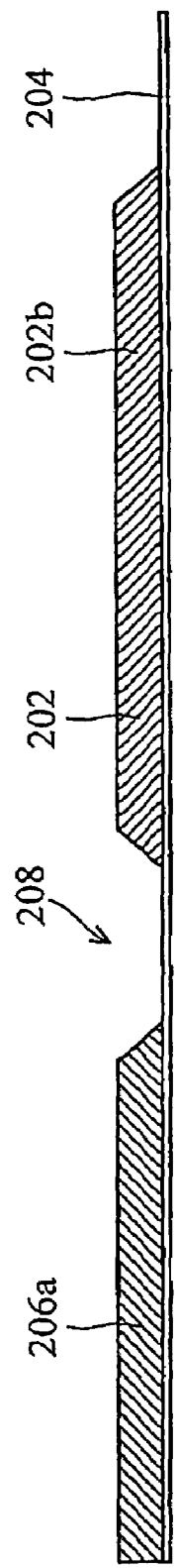

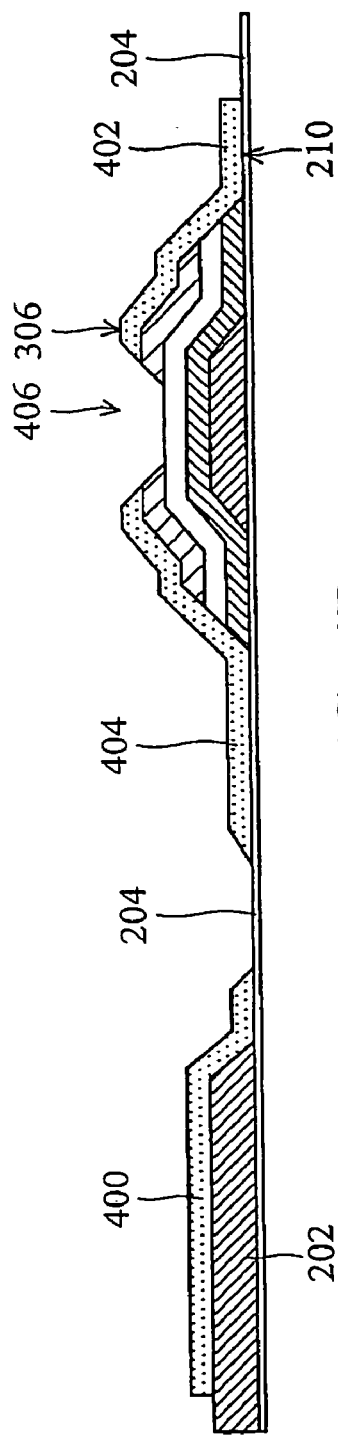
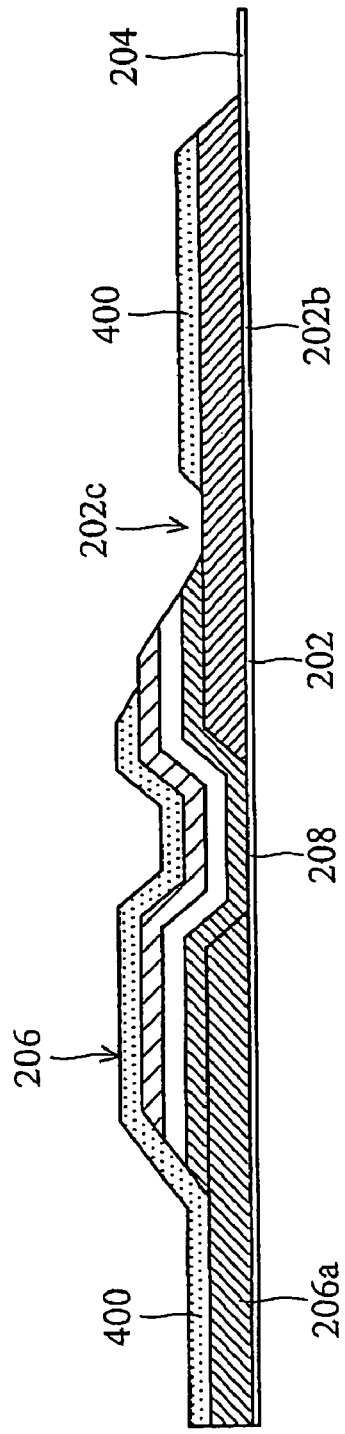
FIG. 4B
FIG. 4C

METHOD OF FABRICATING A THIN FILM TRANSISTOR FOR AN ARRAY PANEL

FIELD OF THE INVENTION

The present invention relates to a thin film transistor, TFT, in an array panel, and more particularly, to a TFT array panel manufactured by a photolithographic process.

BACKGROUND

Prior to the invention, six photolithographic process steps were required to make a TFT in an array panel. FIG. 1A is a diagrammatic view of a first mask process step. According to an industry known conventional photolithographic patterning process, a beam of electromagnetic radiation is directed through a first patterned photolithographic mask. The beam is patterned by the mask and is focused to irradiate a first photo resist layer with an irradiated pattern. The patterned photo resist is washed with a developer to remove the un-irradiated pattern, followed by selective etching of the metal layer, with the patterned photo resist in place, to form a patterned gate (100) of a TFT device and a patterned bus-line conductor (102) on a substrate (104). The bus-line conductor (102) of FIG. 1 represents either a gate bus-line conductor or a data bus-line conductor.

FIG. 1B discloses the substrate (104) of FIG. 1A with an insulation layer to form the gate (100), and additional material layers (106), (108) and (110) resulting from a second mask process step. The second mask process step requires a patterned second photolithographic mask used for irradiating a corresponding second photo-resist with a pattern for selective etching, followed by selective etching with the second patterned photo resist in place. Etching results through both a semiconductor layer (108) and a successive ohmic contact layer (110) on the TFT gate insulation layer (106), to form a patterned TFT device.

FIG. 1C discloses a third mask process step that requires a third photolithographic mask for irradiation of a corresponding third photo resist with a pattern for selective etching, followed by selective etching, with the third patterned photo resist in place, to form a via hole (112) through the gate insulation layer (106) over each corresponding bus-line conductor (102).

FIG. 1D discloses a fourth mask process step. The substrate of FIG. 1C is covered by a second conductor metal layer (114). A fourth photolithographic mask is required for irradiating a corresponding fourth photo-resist with a pattern for selective etching of the second conductor metal layer (114) with a pattern of second bus-line conductor metal on the bus-line conductor (102) and on the TFT device. A notch (116) is etched through the metal layer (114) and each ohmic contact layer (110) and in the semiconductor layer (108) of each TFT device.

FIG. 1E discloses a fifth mask process step. The construction of FIG. 1D is covered by a passivation layer (118). A fifth photolithographic mask is required for irradiating a corresponding fifth photo-resist layer with a pattern for selective etching of the passivation layer with a pattern of via holes (120) exposing contact regions on the patterned, second conductor metal (114).

FIG. 1F discloses a sixth mask process step. A transparent conductive metal layer (122) covers the passivation layer (118) and enters the via holes (120) to connect with the contact regions of the patterned, second conductor metal (114). A sixth photolithographic mask is required for irradiating the transparent metal layer (122) with a pattern. The transparent metal layer (122) is selectively etched to form a pattern of pixel electrodes and storage capacitors on the passivation layer (118), and to form protection material on gate conductor pads and data conductor pads.

SUMMARY OF THE INVENTION

The present invention manufactures a TFT in an array panel in five photolithographic process steps performed by an industry standard photolithographic apparatus. Thus, five photolithographic masks are used, as compared with six photolithographic masks that were used before the invention. The invention reduces the time and materials for making a TFT in an array panel.

According to an embodiment of the invention, a TFT in an array panel is manufactured with a double metal structure in five photolithographic process steps.

According to another embodiment of the invention, a gate insulator material acts as a barrier to avoid electrical contact and electrical shorting between gate bus-line metal and data bus-line metal, where they are separated by a gap at a cross-over region between a gate bus-line and data-bus line.

According to another embodiment of the invention, gate pads and data pads comprise pixel electrode metal, data bus line metal and gate bus line metal.

Embodiments of the invention will now be described by way of example with reference to the accompanying drawings.

BRIEF DESCRIPTION OF THE DRAWINGS

FIG. 2B is a section view taken along the line 2B—2B of FIG. 2A.

FIG. 2C is a section view taken along the line 2C—2C of FIG. 2A.

FIG. 4B is section view taken along the line 4B—4B of FIG. 4A.

FIG. 4C is section view taken along the line 4C—4C of FIG. 4A.

DETAILED DESCRIPTION

Figure 1A:
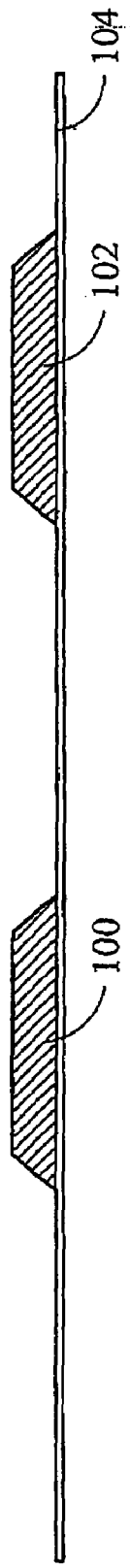
FIG. 1A is a diagrammatic view of a first process step for making a double metal TFT device by performing six photolithographic process steps.
Figure 1B:
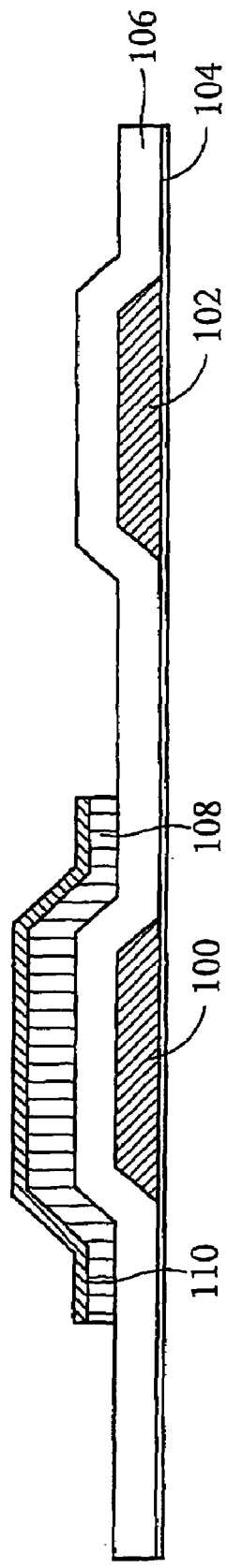
FIG. 1B is a diagrammatic view of a second process step for making a double metal TFT device.
Figure 1C:
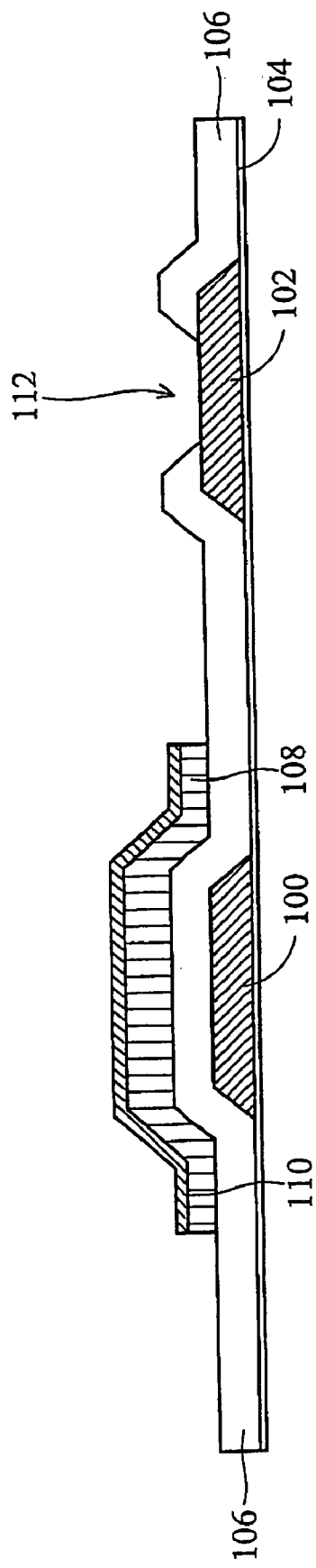
FIG. 1C is a diagrammatic view of a third process step for making a double metal TFT device.
Figure 1D:
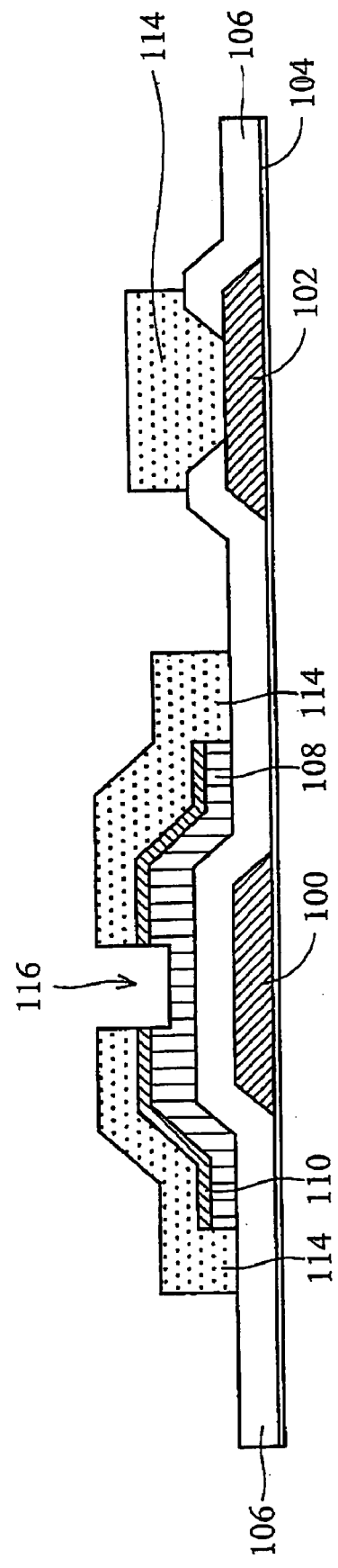
FIG. 1D is a diagrammatic view of a fourth process step for making a double metal TFT device.
Figure 1E:
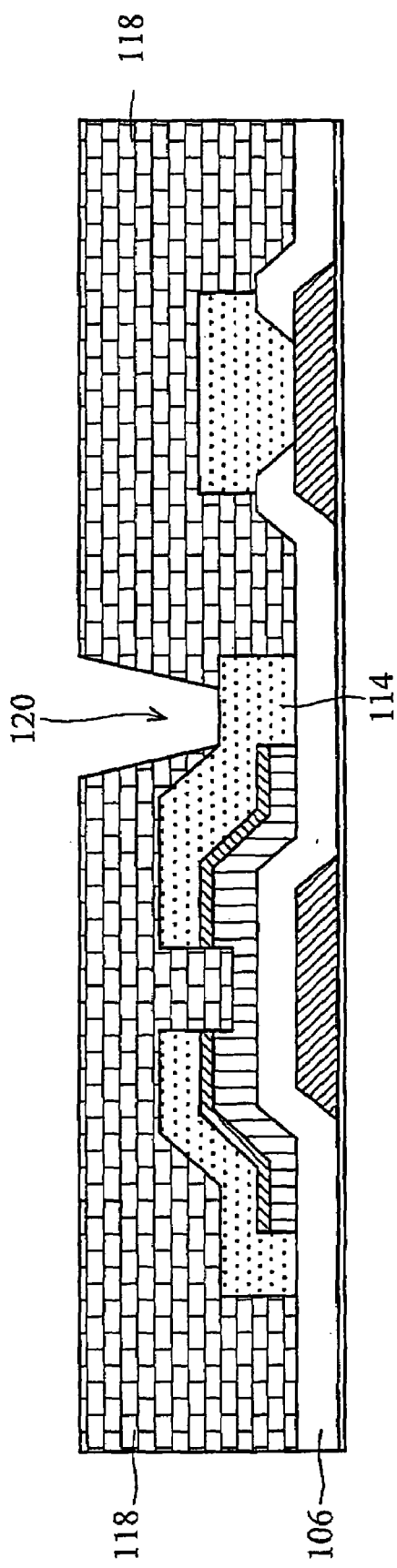
FIG. 1E is a diagrammatic view of a fifth process step for making a double metal TFT device.
Figure 1F:
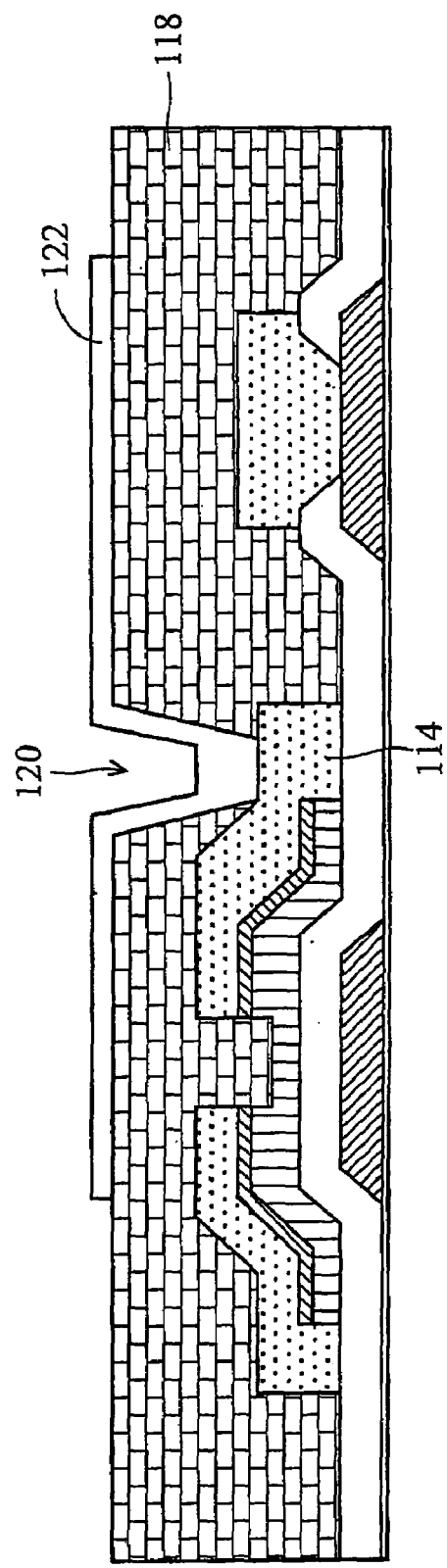
FIG. 1F is a diagrammatic view of a sixth process step for making a double metal TFT device.
Figure 2A:
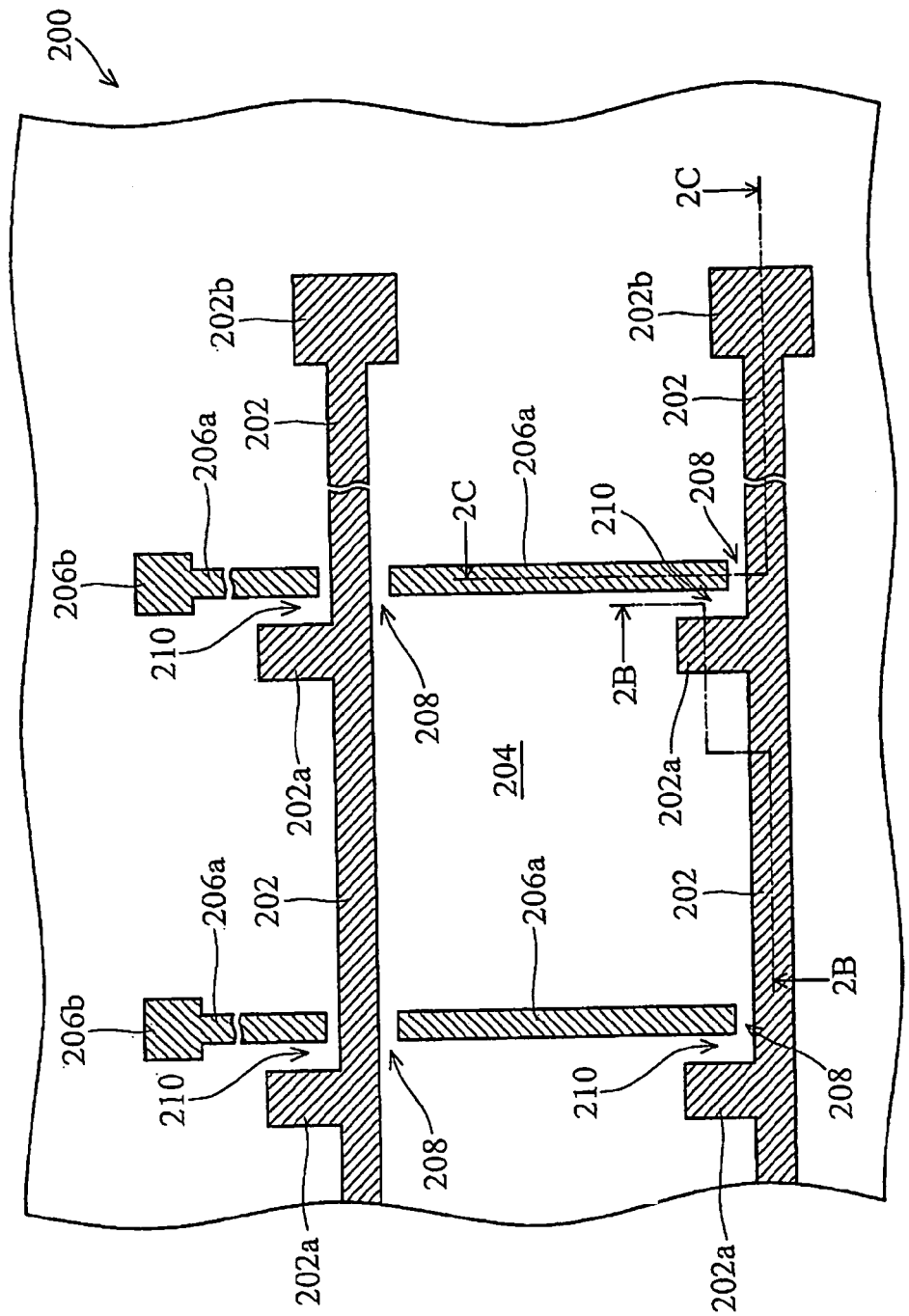
FIG. 2A is a top view of planar data wire segments and multiple gate line buses of a TFT in a TFT array panel.

FIG. 2A discloses a portion of a TFT array panel (200) having a pattern of one or more gate wires or gate bus-line conductors (202) on a substrate (204). Further, FIG. 1 discloses wire segments or data bus-line conductor segments (206a) on the substrate (204). The gate bus-line conductors (202) and the data bus-line conductor segments (206a) are arranged in a pattern of a first metal, a terminology that includes, but is not limited to, metal and other conducting materials. The pattern is produced by a first photolithographic process step.

A first photolithographic process step is performed with industry standard photolithographic apparatus. First, the substrate (204) is covered by a first metal layer that is applied, including and not limited to, being deposited, against the substrate (204), and, in turn, is covered with a first photo-resist that is applied, including and not limited to, being deposited. A first patterned photolithographic mask is required to irradiate the first photo-resist with an irradiated pattern, followed by selective etching the first metal layer, with the patterned photo resist in place, to form the pattern of gate bus-line conductors (202) and data bus-line conductor segments (206a).

Further features are formed by the first lithographic process step. FIG. 2A discloses that the gate bus line conductors (202) have gate electrodes (202a) for gate electrodes of respective TFT devices. The gate bus-line conductors (202) have large area pads (202b) for circuit interconnects. FIG. 2A discloses that some of the data bus-line conductor segments (206a) have large area pads (206b) for circuit interconnects. At cross over regions or first gaps (208) where the data bus-line conductor segments (206a) and the gate bus-line conductors (202) would intersect, the data bus-line conductor segments (206a) are separated from one another by the narrow first gaps (208) from corresponding gate bus-line conductors (202). The gate electrodes (202a) are separated by narrow second gaps (210) from corresponding data bus-line conductor segments (206a). With the second gaps (210) the TFT array panel will work. Thus, the second gaps (210) are features of a further embodiment of the invention.

FIG. 2B discloses the layer thickness of a first metal of an exemplary one of the gate bus-line conductors (202) and the layer thickness of a gate electrode (202a) of a TFT device. FIG. 2C discloses the layer thickness of a first metal of a data bus-line conductor segment (206a) at a cross over region (208). A thickness of a gate bus-line (202) and thickness of a gate bus-line pad (202b) are disclosed.

Figure 3A:
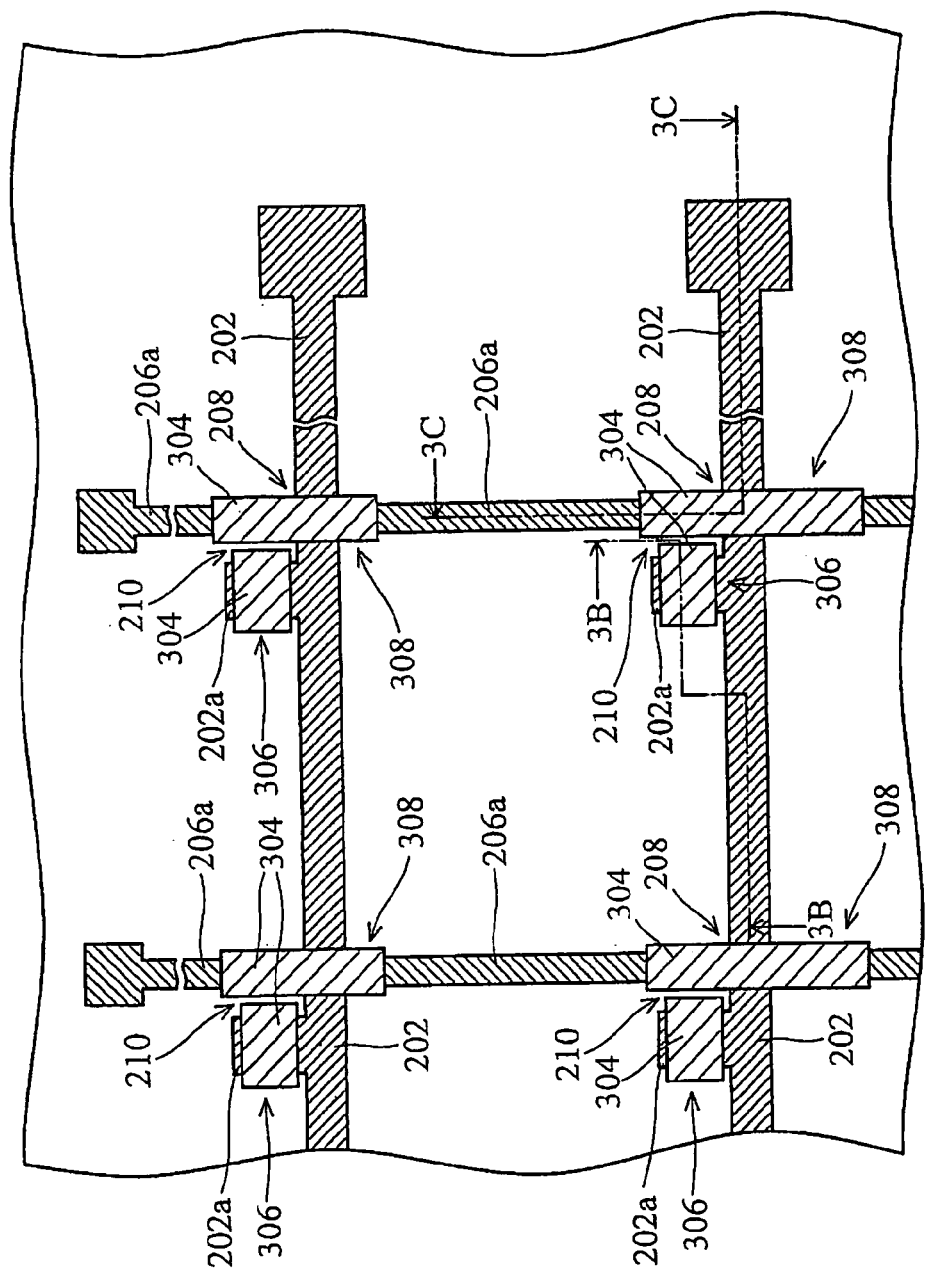
FIG. 3A is a top view similar to FIG. 2A.
Figure 3B:
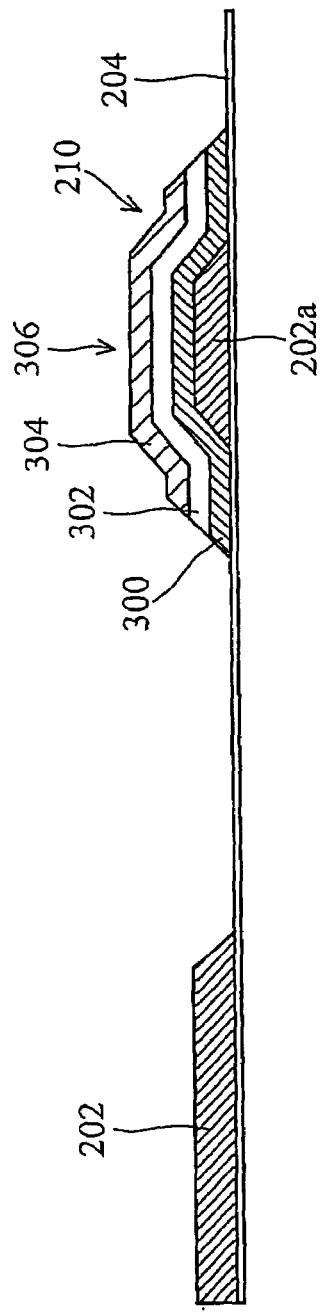
FIG. 3B is section view taken along the line 3B—3B of FIG. 3A.

FIG. 3B discloses the thicknesses of three material layers (300), (302) and (304); a first layer of gate insulation material (300), a second layer of semiconducting material (302) and a third layer of an ohmic contact material (304). The three layers (300), (302) and (304) are successively applied, including and not limited to, being deposited, to cover the substrate (204) of FIG. 1A after patterning of the first metal layer.

A second photolithographic process step is performed with industry standard photolithographic apparatus. The three layers (300), (302) and (304) are covered by a second photo-resist. A patterned second photolithographic mask photo-patterns the second photo-resist, followed by selective etching with the patterned second photo resist in place. Etching occurs through the three layers (300), (302) and (304) to form a three layer, TFT device (306), shown in FIG. 3B. Further, FIG. 3C discloses formation of a three-layer bridging structure (308) crossing over a corresponding gap (208) and bridging between a corresponding gate bus-line conductors (202) and a corresponding data bus-line conductor segment (206a).

The same second photolithographic mask is used in the same process of forming the patterned TFT gate insulation (300) against the TFT gate electrode (202a), and forming the patterned TFT source region and the patterned TFT drain region of the patterned semiconductor material (302). Thus, according to an embodiment of the invention, the second patterned mask patterns three layers of materials (300), (302) and (304), including the patterning of the gate insulator material (300). The second patterned mask eliminates the need for the third mask step disclosed by FIG. 1C, of the previous six step process. The three layers of materials, are the gate insulator material (300), a-Si:H material (302) and n+a-Si:H material (304). The three layers of materials (300), (302) and (304) on the gate electrode (202a) act as a TFT device, when the three layers are patterned to form the source and drain electrode. The patterned a-Si:H material (302) is the semiconductor layer of the TFT device. The TFT channel will form on the interface of the patterned gate insulator material (300) and the patterned a-Si:H material (302) when an electrode field exists. The patterned n+a-Si:H material (304) acts as an ohmic contact layer of the TFT device.

Figure 3C:
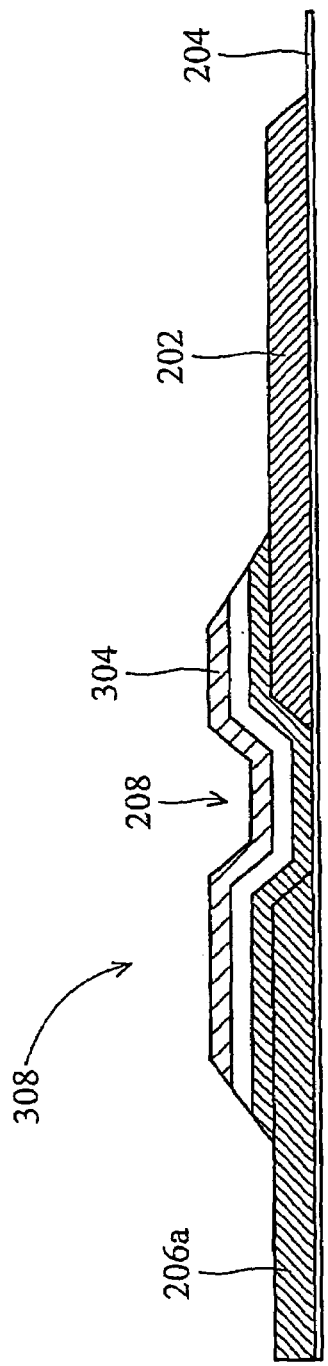
FIG. 3C is section view taken along the line 3C—3C of FIG. 3A.

According to an embodiment of the invention, the second patterned mask process step patterns the gate insulator material (300), together with, the a-Si:H material (302) and n+a-Si:H material (304), in each first gap (208) against the substrate (204), to act as an electrical barrier to avoid electrical contact and electrical shorting between one of the gate bus-line conductors (202) and one of the data bus-line conductor segments (206a), where they are separated by a corresponding first gap (208) against the substrate (204). Further, the first gap (208) is at a cross over region between a gate bus-line conductor (202) and a data-bus line conductor segment (206a). FIG. 3C discloses that the gate insulation material (300) is patterned to fill the narrow first gap (208) at each cross over region. Further, the gate insulation material (300) forms a junction with the substrate (204) at the cross over region (208) to provide an electrical barrier between a corresponding data bus-line conductor segment (206a) and a corresponding gate bus-line conductor (202). The purpose of patterning the three layers of materials (300), (302) and (304) in each cross over region is to prevent electrical shorting between a continuous gate bus line (202) and a data bus line which becomes continuous when patterned by a third patterned mask process step as disclosed with reference to FIGS. 4A–4C.

According to a further embodiment of the invention, as disclosed by FIGS. 3A–3C, when the second gaps (210) are present, the gate insulator material (300), together with, the a-Si:H material (302) and n+a-Si:H material (304), in each second gap (210) are patterned by the second patterned mask to act as an electrical barrier between a TFT device (306) and a data bus-line conductor (202). FIG. 3A discloses that the second gap (210) against the substrate (204) between the gate electrode (202a) and the data bus-line conductor segment (206a) is partly filled by a barrier provided by the patterned TFT layers of the TFT device (306). The patterned gate insulation (300), together with, the a-Si:H material (302) and n+a-Si:H material (304), form a junction with the substrate (204) in the second gap (210) to provide an electrical barrier between a corresponding data bus-line conductor (202) and a TFT device (306). Further, the second gap (210) is partly filled by a barrier provided by the patterned gate insulation material (300) of the patterned cross over device (308). The purpose of patterning the three layers of materials (300), (302) and (304) in each cross over region is to prevent electrical shorting between a continuous gate bus line (202) and a data bus line which becomes continuous when patterned by a third patterned mask process step as disclosed with reference to FIGS. 4A–4C.

Figure 4A:
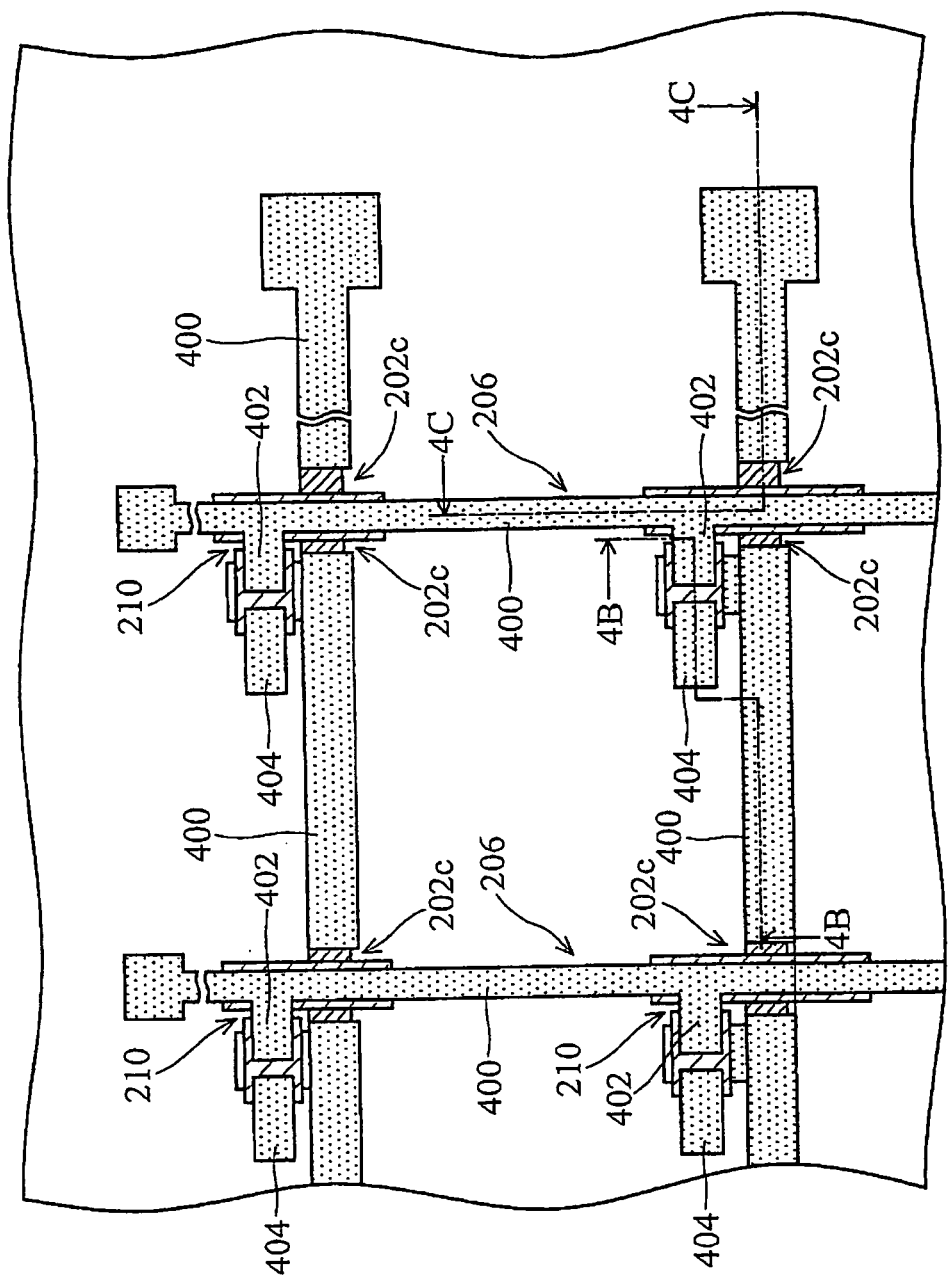
FIG. 4A is a top view similar to FIG. 3A.

FIG. 4A discloses the portion of a TFT array panel (200) having a pattern of second conductor metal, a terminology including, but not limited to, metal and other conducting materials. Further, FIG. 4A discloses a pattern of the second conductor metal that is produced by a third photolithographic process step.

First, the TFT array panel (200) substrate (204) is covered by a layer of second conductor metal (400) after patterning the previous three layers (300), (302) and (304). The second conductor metal (400) is against the substrate (204), particularly next to the TFT device (306). Further, the second conductor metal (400) increases the thickness of the data bus-lines (202) and the gate bus-line conductor segments (206a). Further, the second conductor metal (400) is against the TFT ohmic contact layer that has been patterned as disclosed by FIG. 3A.

A third photolithographic process step is performed with industry standard photolithographic apparatus. First, the second conductor metal (400) is covered with a third photo-resist. A third patterned photolithographic mask is required to irradiate the third photo-resist with an irradiated pattern, followed by selective etching the layer of second conductor metal (400), with the patterned photo resist in place, to form a patterned second metal conductor (400), as disclosed by FIGS. 4A, 4B and 4C.

More specifically, FIGS. 4A and 4C disclose the patterned second conductor metal (400) extending across the cross over regions (208) to join and bridge between separated data bus line conductor segments (206a) to form continuous data bus-line conductors (206). The second conductor metal (400) covers and provides increased metal thickness for the data bus-line conductors (206) and the pads (206b) of the data bus-line conductors (206), and the pads (202b) of the gate bus-line conductor segments (206a).

FIGS. 4A and 4B disclose segments of the patterned second conductor metal (400) extending over the first metal of the gate bus-line conductors (202) to provide an increased metal thickness to the gate bus line conductors (202) and the pads (202b). With reference to FIG. 4A, the patterned second conductor metal (400) on the gate bus line conductor (202) is discontinuous at (202C) at each cross over region, and is spaced from the continuous data bus-line conductor (206) to prevent electrical shorting.

FIG. 4B discloses the patterned second conductor metal (400) extending over the TFT device (306). More specifically, the second conductor metal (400) covers the patterned ohmic conductor material (304) on the TFT device (306). The second conductor metal (400) is etched to divide the second conductor metal (400) into a TFT drain electrode terminal (404) and a TFT source electrode terminal (402). As shown in FIG. 4A and FIG. 4B, when a corresponding gap (210) is present, the TFT source conductor terminal (402) extends against the substrate (204) to connect with a corresponding data bus-line conductor (206). If the gap (210) is not present, the source conductor terminal (402) will connect with a data bus-line conductor (206) without extending against the substrate (204). As shown in FIG. 4A, the TFT drain electrode terminal (402) connects with a corresponding data bus-line conductor (206). The TFT gate insulator material (300), together with, the a-Si:H material (302) and n+a-Si:H material (304), separate the gate electrode (202a) from both the TFT source electrode and the TFT drain electrode.

Figure 5A:
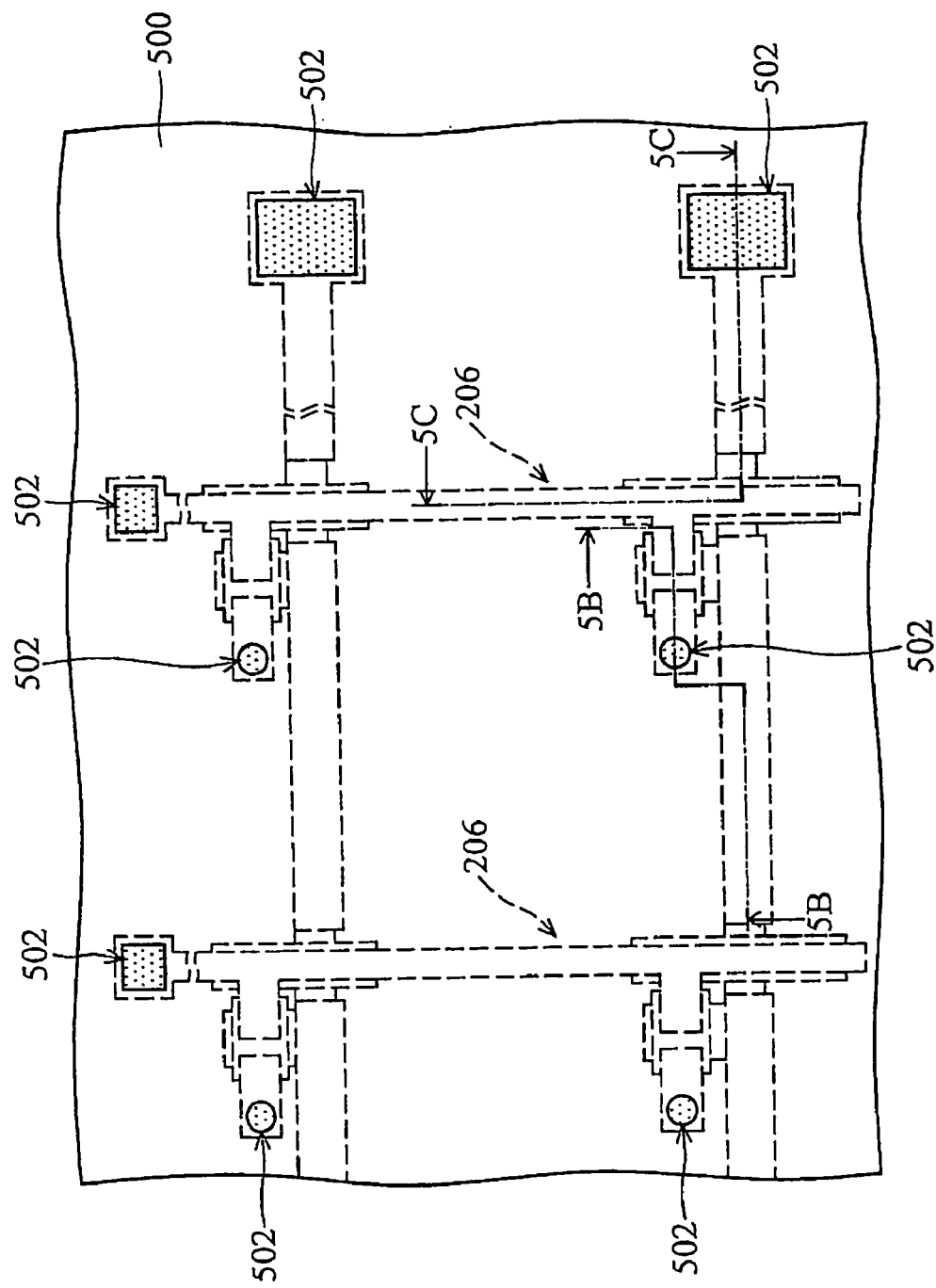
FIG. 5A is a top view similar to FIG. 4A.
Figure 5B:
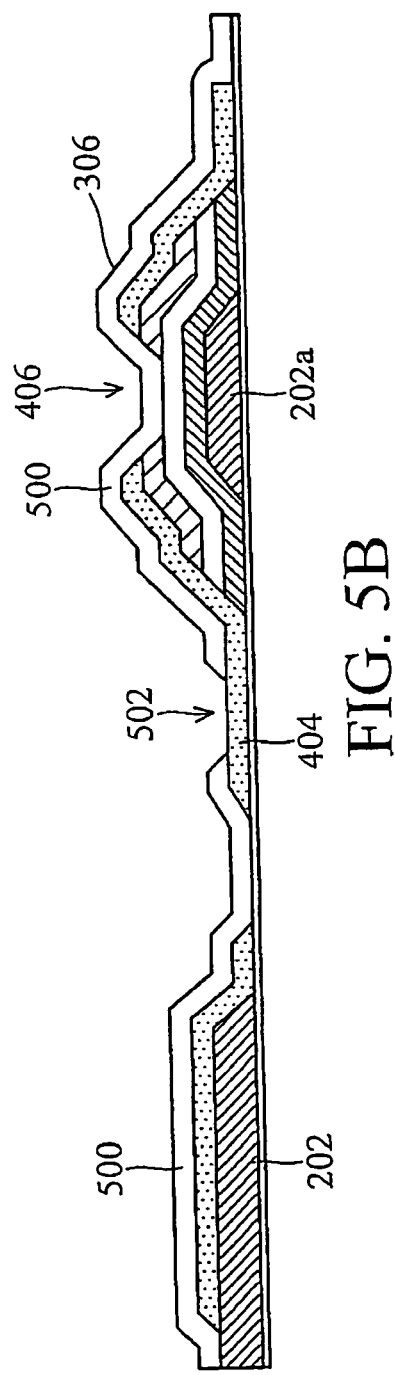
FIG. 5B is section view taken along the line 5B—5B of FIG. 5A.
Figure 5C:
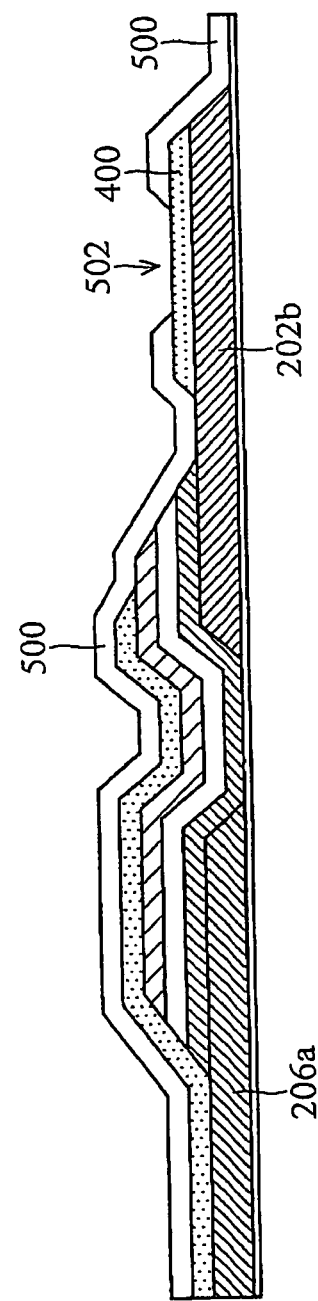
FIG. 5C is section view taken along the line 5C—5C of FIG. 5A.

FIG. 5A discloses that the TFT array panel (200) is covered by a patterned passivation layer (500) that is applied, including and not limited to, being deposited. A fourth photolithographic process step is performed with industry standard photolithographic apparatus. First, the passivation layer (500) covers the TFT array panel (200) after patterning the second conductor metal (400). Then the passivation layer (500) is covered with a fourth photo-resist. A fourth patterned photolithographic mask is required to irradiate the fourth photo-resist with an irradiated pattern, followed by selective etching the passivation layer (500), with the patterned photo resist in place, to form a patterned passivation layer (500). The patterned passivation layer (500) is etched through to provide via holes (502) open to the pads (202b) and (206b) and the source electrode terminals (404). With reference to FIG. 4B, the patterned passivation layer covers the substrate (204) and covers the notch (406) in the TFT device (306).

Figure 6A:
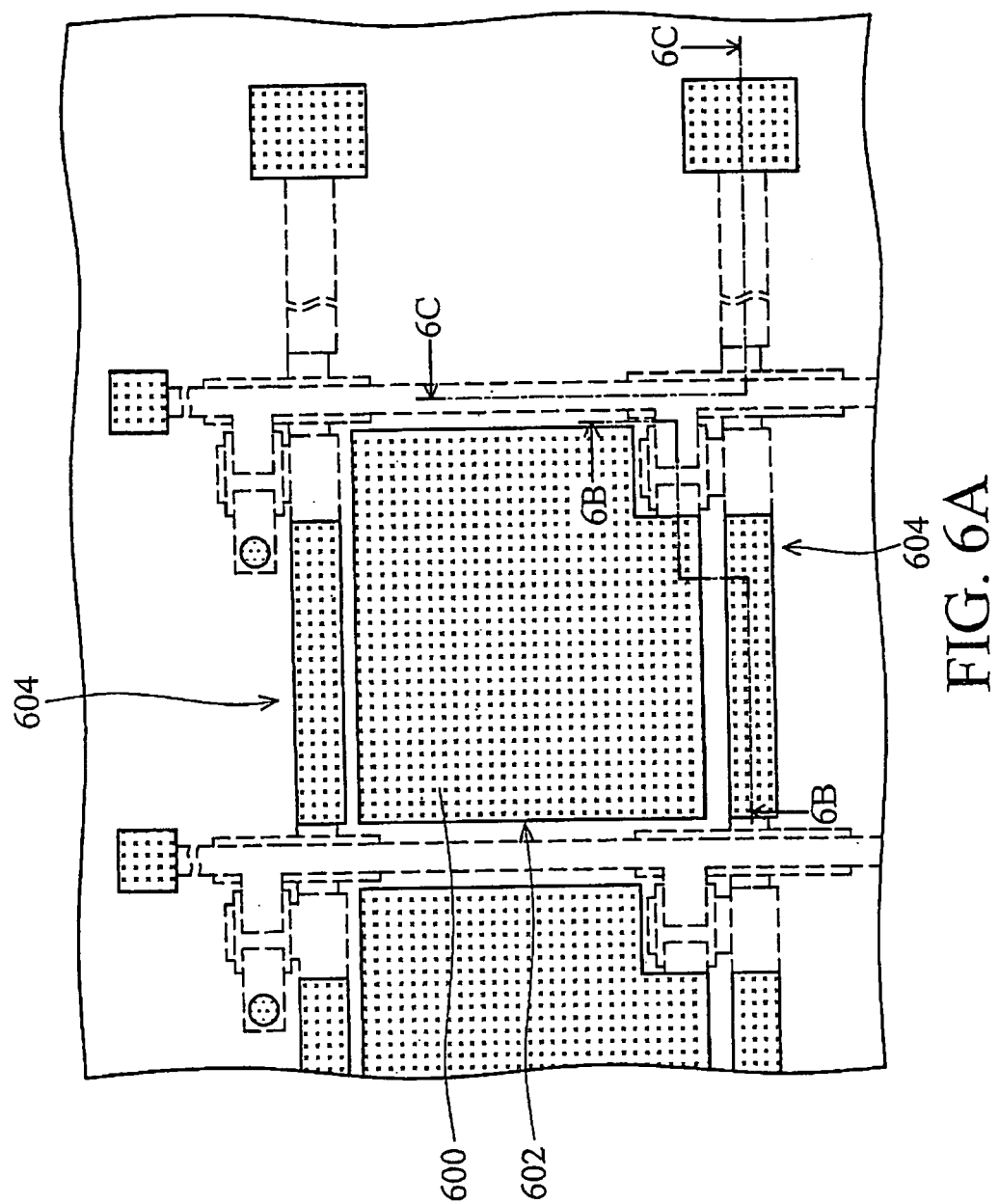
FIG. 6A is a top view similar to FIG. 5A.
Figure 6B:
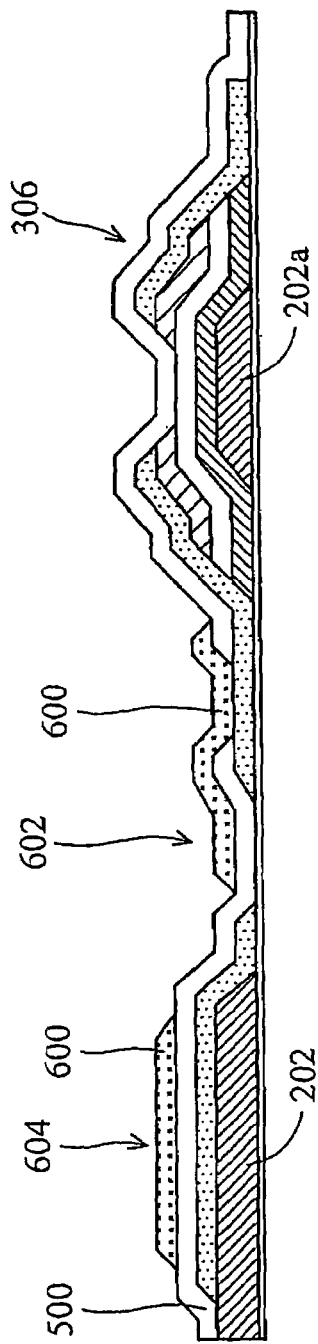
FIG. 6B is section view taken along the line 6B—6B of FIG. 6A.
Figure 6C:
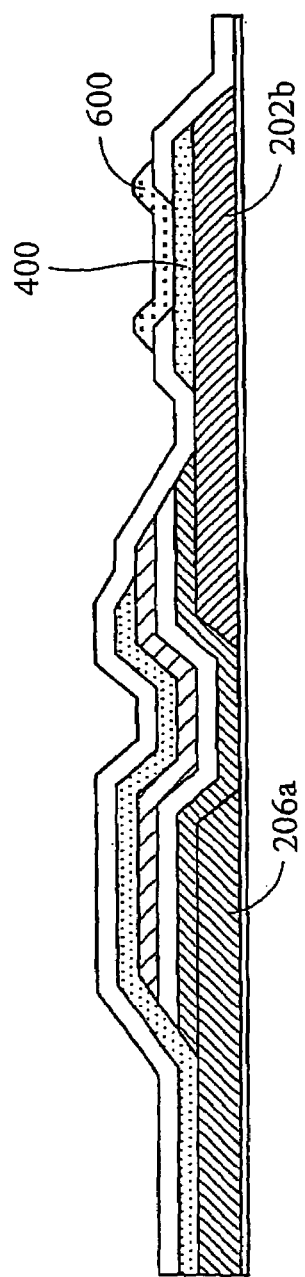
FIG. 6C is section view taken along the line 6C—6C of FIG. 6A.

FIG. 6A discloses a patterned transparent conducting material (600), including, and not limited to, a transparent conducting metal (600) which has been applied, including and not limited to, being deposited, against the patterned passivation layer (500). A layer of the transparent conducting metal (600) covers the passivation layer (500). A fifth and final photolithographic process step is performed with industry standard photolithographic apparatus. First, a layer of transparent conducting metal (600) covers the TFT array panel (200) after patterning the passivation layer (500). Then, a fifth photo-resist covers the transparent conducting metal (600). A fifth patterned photolithographic mask is required to irradiate the fifth photo-resist with an irradiated pattern, followed by selective etching the transparent conducting metal (600) to provide a corresponding, patterned, large area pixel electrode (602) overlying the substrate (204) in an area bounded by spaced apart data bus-line conductors (206) and by spaced apart gate bus-lines (202). The etched transparent conducting metal (600) provides patterned storage capacitors (604) along the gate bus lines (202). The transparent conducting metal (600) is patterned on the source electrodes (402), and fully covers the via holes in the source electrodes (402), for transfer of electrical current from the source electrodes (402) to the pixel electrode (602) and the storage capacitors (604).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for making thin film transistors, TFTs, on a substrate, comprising the steps of:

patterning and etching a first conductor metal that has been applied on the substrate to comprise continuous gate bus-lines having gate electrodes, and to comprise data bus-lines having corresponding data bus-line segments separated from one another at cross over regions where the data bus-lines and the gate bus-lines would intersect;

applying a gate insulator material on the array panel after the step of patterning and etching the first conductor metal; and patterning and etching the gate insulator material such that the gate insulator material bridges first gaps between the gate bus-lines and the corresponding data bus-line segments thereby electrically isolating the continuous gate bus-lines from the data bus line segments.

2. The method of claim 1, further comprising the step of:

patterning and etching the gate insulator material to comprise a gate insulators of TFTs and electrical barriers in second gaps between the TFTs and the corresponding data bus-line segments.

3. The method of claim 2, further comprising the steps of:

applying a second layer of TFT semiconducting material on the gate insulator material;

applying a third layer of TFT ohmic contact material;

patterning and etching the third layer and the second layer and the gate insulator material to comprise a TFT having a first layer of TFT gate insulation, and having a second layer of TFT semiconducting material, and having a third layer of TFT ohmic contact material.

4. The method of claim 3, further comprising the step of:

patterning the third layer and the second layer and the gate insulator material with a single patterned mask of a photolithographic apparatus.

5. The method of claim 3, further comprising the step of:

patterning the layer of TFT gate insulation, the layer of semiconducting material and the layer of ohmic contact material with a patterned mask in a single photolithographic process step.

6. The method of claim 3, further comprising the step of:

patterning a transparent conductive material to cover via holes in source electrode terminals of the TFT.

7. The method of claim 1, further comprising the step of:

patterning the first layer of TFT gate insulation, the second layer of semiconducting material and the third layer of ohmic contact material with a patterned mask in a single photolithographic process step.

8. A method for making a thin film transistor, TFT, on a substrate, comprising the steps of:

photolithographic patterning and etching of three layers of materials to form a TFT and to simultaneously form a bridging structure crossing over a TFT gate bus-line conductor at a cross over region, said bridging structure electrically isolating the gate bus-line conductor from each of a pair of opposed data base-line segments separated from one another at cross over regions where the data bus-lines and the gate bus-lines would intersect; and photolithographic patterning and etching of a conductor metal to form a TFT source electrode terminal and a TFT drain electrode terminal, and to electrically couple the opposed data base-line segments and comprise a continuous data bus-line extending over the bridging structure.

9. The method of claim 8, further comprising the step of:

photolithographic patterning of the three layers with a single patterned mask of a photolithographic apparatus.

* * * * *